United States Patent [19]

Kaneno et al.

[11] Patent Number: 4,757,510
[45] Date of Patent: Jul. 12, 1988

[54] SEMICONDUCTOR LASER DEVICE

[75] Inventors: Nobuaki Kaneno; Kenji Ikeda, both of Itami, Japan

[73] Assignee: Mitsubishi Denki Kabushiki Kaisha, Tokyo, Japan

[21] Appl. No.: 911,153

[22] Filed: Sep. 24, 1986

[30] Foreign Application Priority Data

Sep. 26, 1985 [JP] Japan .............................. 60-213029

[51] Int. Cl.$^4$ ............................................. H01S 3/19
[52] U.S. Cl. ....................................... 372/45; 357/17; 372/46
[58] Field of Search ................ 372/44, 45, 46; 357/17

[56] References Cited

U.S. PATENT DOCUMENTS 4,480,331 10/1984 Thompson ............................. 372/46

OTHER PUBLICATIONS

"Single-Longitudinal-Mode Metalorganic Chemical-Vapor-Deposition Self-Aligned GaAlAs--GaAs Double-Heterostructure Lasers", by J. J. Coleman et al., Applied Physics Letters, Aug. 1, 1980, pp. 262 and 263.

Primary Examiner—James W. Davie
Assistant Examiner—Georgia Y. Epps
Attorney, Agent, or Firm—Birch, Stewart, Kolasch & Birch

[57] ABSTRACT

A semiconductor laser device which includes a first conductivity type semiconductor substrate; a first conductivity type first cladding layer, an active layer, and a second conductivity type second cladding layer successively provided on the substrate, wherein both the cladding layers have energy band gaps larger than that of the active layer; a first conductivity type current blocking layer having an energy band gap larger than that of the second cladding layer being provided on the second cladding layer, having a groove removed therefrom so as to form an exposed stripe portion on the second cladding layer; and a second conductivity type third cladding layer having an energy band gap smaller than that of the current blocking layer and larger than that of the active layer formed on the current blocking layer and on the stripe portion.

5 Claims, 3 Drawing Sheets

SEMICONDUCTOR LASER DEVICE

FIELD OF THE INVENTION

The present invention relates to a high output semiconductor laser device which oscillates at a fundamental transverse mode.

BACKGROUND OF THE INVENTION

FIG. 4 shows a structure of a prior art self-alignment type semiconductor laser shown in Applied Physics Letters No. 37, No. 3 (1980) pp 262 to 263. In FIG. 4, the reference numeral 1 designates an n type GaAs substrate, the numeral 2 designates an n type AlGaAs lower cladding layer, the numeral 3 designates a GaAs active layer, the numeral 4 designates a p type AlGaAs upper cladding layer, the numeral 10 designates an n type GaAs blocking layer, the numeral 6 designates a p type AlGaAs upper cladding layer embedded in a groove which is obtained by etching the blocking layer 10 in a stripe configuration. The numeral 7 designates a p type GaAs contact layer, the numeral 8 designates an n-electrode, the numeral 9 designates a p-electrode. The upper and lower cladding layers 4 and 2 have energy band gaps larger than that of the active layer 3, and the blocking layer 10 has an energy band gap smaller than those of the upper cladding layers 4 and 6. Herein, the energy band gaps of the upper cladding layers 4 and 6 may be equal to or different from each other.

The device is operated as follows.

A light generated at the active layer 3 is confined in the active layer 3 by the refractive index difference between the active layer 3 and the upper and lower cladding layers 4 and 2 adjacent thereto. Furthermore, the widening of the light in the direction parallel with the active layer 3, that is, in the transverse direction is restricted by the light absorption and the current confinement by the current blocking layer 10, and thus the light is guided well.

In this prior art semiconductor laser device with such a construction, the widening of the light in the transverse direction is restricted by the light absorption by the n type GaAs current blocking layer 10, thereby resulting in a lower differential quantum efficiency and a difficulty in making higher the output power due to this light absorption loss.

SUMMARY OF THE INVENTION

It is an object of the present invention to provide an improved semiconductor laser device which oscillates at a fundamental transverse mode having a high differential quantum efficiency without any light absorption loss by the blocking layer and capable of making higher the output power.

Other objects and advantages of the present invention will become apparent from the detailed description given hereinafter. It should be understood, however, that the detailed description and specific embodiment are given by way of illustration only, since various changes and modifications within the spirit and scope of the invention will become apparent to those skilled in the art from this detailed description.

According to the present invention, there is provided a semiconductor laser device which includes a first conductivity type semiconductor substrate; a first conductivity type first cladding layer, an active layer, and a second conductivity type second cladding layer successively provided on the substrate, wherein both the cladding layers have energy band gaps larger than that of the active layer; a first conductivity type current blocking layer having an energy band gap larger than that of the second cladding layer, being provided on the second cladding layer and having a groove removed therefrom so as to form a stripe portion on the second cladding layer, and a second conductivity type third cladding layer having an energy band gap smaller than that of the current blocking layer and larger than that of the active layer formed on the current blocking layer and on the stripe portion.

DETAILED DESCRIPTION OF THE PREFERRED EMBODIMENTS

Figure 1:
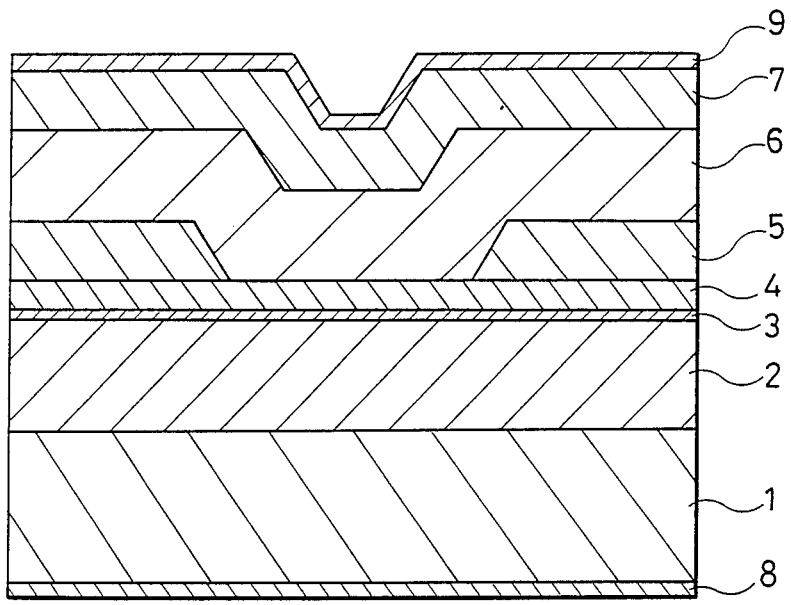
FIG. 1 is a cross sectional view showing a side view of a semiconductor laser device as an embodiment of the present invention.

In order to explain the present invention in detail, reference will be particularly made to FIG. 1.

In FIG. 1, the reference numeral designates an n type GaAs substrate and the numerals 2 to 5 designate crystalline layers grown on the substrate 1 successively. Reference numeral 2 designates an n type AlGaAs lower cladding layer, the numeral 3 designates a GaAs or AlGaAs active layer, and the numeral 4 designates a p type AlGaAs upper cladding layer. The upper and lower cladding layers 4 and 2 have an energy band gap larger than that of the active layer 3. The reference numeral 5 designates an n type AlGaAs current blocking layer having an energy band gap larger than that of the upper cladding layer 4. The reference numerals 6 and 7 designate crystalline layers grown and embedded by a MO-CVD method after forming a stripe groove by removing the current blocking layer 5 in a stripe configuration. The reference numeral 6 designates a p type AlGaAs layer having the same composition and the same energy band gap as those of the cladding layer 4, and the reference numeral 7 designates a p type GaAs contact layer. The numeral 8 designates an n-electrode, and the numeral 9 designates a p-electrode.

The device is operated as follows.

Figure 2:
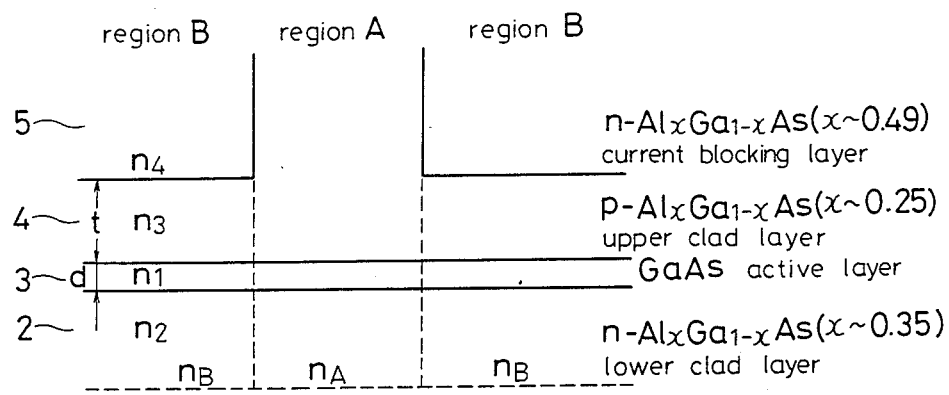
FIG. 2 is a diagram showing a calculation model for producing the embodiment of the present invention.
Figure 3:
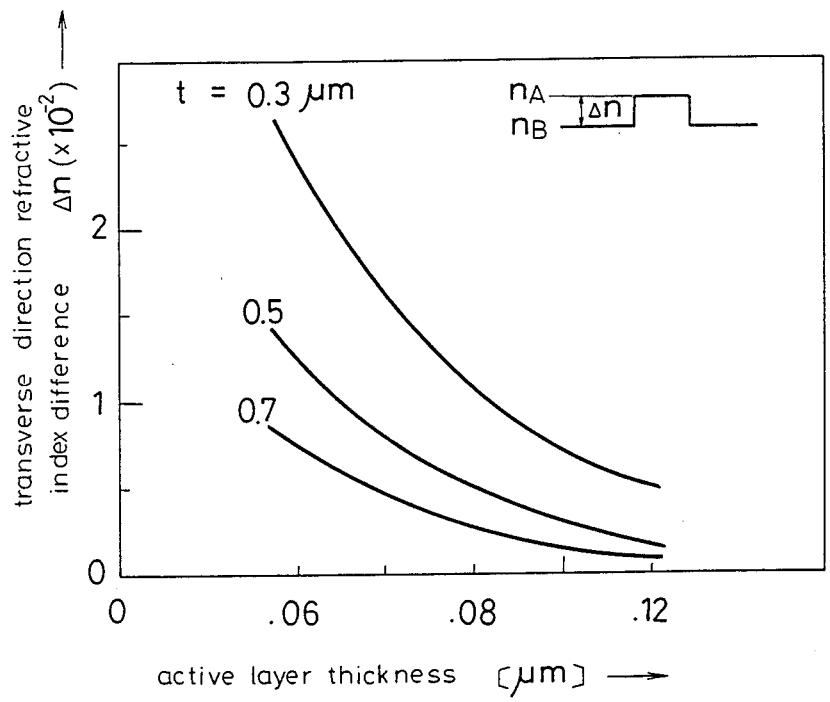
FIG. 3 is a diagram showing the relationship between the tranverse direction refractive index difference and the active layer thickness calculated with the use of the model shown in FIG. 2.
Figure 4:
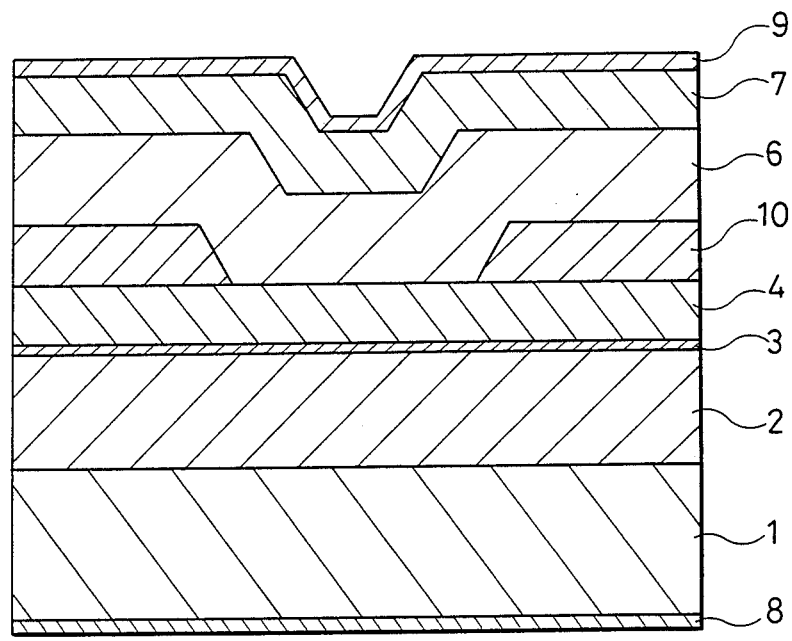
FIG. 4 is a cross-sectional view showing the side view of a prior art semiconductor laser device.

FIG. 2 shows a calculation model for producing the semiconductor laser device of FIG. 1 in a case where n type $Al_xGa_{1-x}As$ (X~0.35) is used for the lower cladding layer 2, GaAs is used for the active layer 3, p type $Al_xGa_{1-x}As$ (x~0.25) is used for the upper cladding layer 4 and the embedding layer 6, and n type $Al_xGa_{1-x}As$ (x~0.49) is used for the current blocking layer 5. FIG. 3 shows the relation between the thickness of the active layer d and the refractive index difference in the transverse direction $\Delta n$ with regard to the thickness t of the upper cladding layer 4 as a parameter. As shown in FIG. 3, it is possible to obtain an effective refractive index difference in the transverse direction, that is, in the direction parallel with the active layer by making the thickness t of the upper cladding layer 4 or the thickness d of the active layer 3 thin, and it is possible to produce a refractive index guiding type stripe laser having a waveguide region with a refractive index higher than that of the outside region. In this embodiment, the energy band gap of the current blocking layer 5 is larger than those of the upper and the lower cladding layers 2 and 4, and the refractive index of the waveguide region is still higher than that of the outside region in the above described refractive index guiding type stripe laser. In this device, the light confinement into the waveguide region is strengthened, thereby resulting in a laser having a high differential quantum efficiency which provides for oscillation at a fundamental transverse mode.

In the above-illustrated embodiment, a GaAs layer is used for the active layer 3, but an AlGaAs layer can be used for this active layer. Furthermore, an AlGaAs group laser is described, but a quarternary mixture crystalline semiconductor laser such as of InGaAlP or InGaAsP group can be constructed with the same effects as described above.

As is evident from the foregoing description, according to the present invention, a crystalline layer having an energy band larger than that of the upper cladding layer and the embedded layer is used for the current blocking layer, thereby allowing for an effective transverse refractive index difference by making thin either the active layer or the upper cladding layers, which is positioned between the current blocking layer and the active layer, whereby a high differential quantum efficiency and high output semiconductor laser is obtained which oscillates at a fundamental transverse mode.

What is claimed is:

1. A semiconductor laser device having a waveguide structure comprising:
    a first conductivity type semiconductor substrate;
    a first conductivity type first cladding layer formed on said substrate;
    an active layer formed on said first cladding layer;
    a second conductivity type second cladding layer formed on said active layer, wherein said first and second cladding layers have energy band gaps larger than that of said active layer;
    a first conductivity type current blocking layer having an energy band gap larger than that of said second cladding layer formed on said second cladding layer, wherein a groove is formed in said current blocking layer so as to form an exposed stripe portion on said second cladding layer; and
    a second conductivity type third cladding layer having an energy band gap smaller than that of said current blocking layer and larger than that of said active layer, said third cladding layer being formed on said current blocking layer and on said stripe portion of said second cladding layer,
    wherein said first, second, and third cladding layers have a refractive index different from that of said active layer, and wherein said first and second cladding layers have a refractive index different from that of said current blocking layer so as to provide for an effective refractive index in a transverse direction parallel to said active layer, said waveguide structure guiding light generated at said active layer.

2. A semiconductor laser device as defined in claim 1, wherein said substrate comprises GaAs, said active layer comprises $Al_xGa_{1-x}As$, said first cladding layer comprises $Al_{y1}Ga_{1-y1}As$, said second cladding layer comprises $Al_{y2}Ga_{1-y2}As$, said third cladding layer comprises $Al_{y3}Ga_{1-y3}As$, and said current blocking layer comprises $Al_zGa_{1-z}As$, wherein x, $y_1$, $y_2$, $y_3$, and z have the following relationships $0 < x < y_1, y_2, y_3$, and $y_2, y_3 < z$.

3. A semiconductor laser device as defined in claim 1, wherein said active layer, said cladding layers, or said current blocking layer comprises InGaAlP quarternary mixture crystalline semiconductor.

4. A semiconductor laser device as defined in claim 1, wherein said active layer, said cladding layers, or said current blocking layer comprises InGaAsP quarternary mixture crystalline semiconductor.

5. A semiconductor laser device as defined in claim 2 further comprising a contact layer formed on said third cladding layer and electrodes formed on said substrate and said contact layer, and wherein the refractive index of said third cladding layer is equal to that of said cladding layer, said waveguide structure exhibiting improved light confinement properties.

* * * * *